(12) United States Patent
Sugawara et al.

(10) Patent No.: US 10,811,237 B2
(45) Date of Patent: Oct. 20, 2020

(54) MN—ZN—O SPUTTERING TARGET AND PRODUCTION METHOD THEREFOR

(71) Applicant: Dexerials Corporation, Shinagawa-ku, Tokyo (JP)

(72) Inventors: Junichi Sugawara, Tome (JP); Yuichi Kamori, Tome (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 421 days.

(21) Appl. No.: 15/546,666

(22) PCT Filed: Nov. 2, 2016

(86) PCT No.: PCT/JP2016/082591
§ 371 (c)(1),
(2) Date: Jul. 27, 2017

(87) PCT Pub. No.: WO2017/078064
PCT Pub. Date: May 11, 2017

(65) Prior Publication Data
US 2018/0019109 A1   Jan. 18, 2018

(30) Foreign Application Priority Data

Nov. 5, 2015  (JP) ................................. 2015-217825

(51) Int. Cl.
*C23C 14/34*        (2006.01)
*H01J 37/34*        (2006.01)
(Continued)

(52) U.S. Cl.
CPC ........ *H01J 37/3426* (2013.01); *C04B 35/453* (2013.01); *C04B 35/62635* (2013.01);
(Continued)

(58) Field of Classification Search
CPC .................................................. H01J 37/3426
See application file for complete search history.

(56) References Cited

U.S. PATENT DOCUMENTS 5,480,531 A * 1/1996 Weigert .................. C04B 35/01
                                                      204/298.13
2004/0231981 A1* 11/2004 Takahashi ............. C23C 14/086
                                                      204/298.13
(Continued)

FOREIGN PATENT DOCUMENTS

CN         1397661 A       2/2003
CN       107148495 A       9/2017
(Continued)

OTHER PUBLICATIONS

May 8, 2018, International Preliminary Report on Patentability issued in the International Patent Application No. PCT/JP2016/082591.

(Continued)

*Primary Examiner* — Jason Berman
(74) *Attorney, Agent, or Firm* — Kenja IP Law PC

(57) ABSTRACT

Provided is a Mn—Zn—O sputtering target which can be used in DC sputtering, and a production method for the target. The Mn—Zn—O sputtering target comprises a chemical composition containing Mn, Zn, O, and at least one element X, the element X being a single one or two elements selected from the group consisting of W and Mo. The target has a relative density of 90% or more and a specific resistance of $1\times10^{-3}$ Ω·cm or less.

4 Claims, 1 Drawing Sheet

(51) Int. Cl.
  *C04B 35/453*  (2006.01)
  *C04B 35/645*  (2006.01)
  *G11B 7/243*  (2013.01)
  *C04B 35/626*  (2006.01)
  *C23C 14/08*  (2006.01)
  *G11B 7/241*  (2006.01)
  *C04B 35/64*  (2006.01)
  *G11B 7/26*  (2006.01)

(52) U.S. Cl.
  CPC ............ *C04B 35/64* (2013.01); *C04B 35/645* (2013.01); *C04B 35/6455* (2013.01); *C23C 14/08* (2013.01); *C23C 14/083* (2013.01); *C23C 14/086* (2013.01); *C23C 14/3414* (2013.01); *G11B 7/241* (2013.01); *G11B 7/243* (2013.01); *C04B 2235/3256* (2013.01); *C04B 2235/3258* (2013.01); *C04B 2235/3263* (2013.01); *C04B 2235/3268* (2013.01); *C04B 2235/3284* (2013.01); *C04B 2235/404* (2013.01); *C04B 2235/5436* (2013.01); *C04B 2235/656* (2013.01); *C04B 2235/72* (2013.01); *C04B 2235/77* (2013.01); *G11B 7/266* (2013.01); *G11B 2007/2432* (2013.01); *G11B 2007/24304* (2013.01); *G11B 2007/24306* (2013.01)

(56) References Cited

U.S. PATENT DOCUMENTS

| | | | | |
|---|---|---|---|---|
| 2008/0063889 | A1* | 3/2008 | Duckham | ............ B23K 1/0006 |
| | | | | 428/615 |
| 2013/0306469 | A1* | 11/2013 | Kanamaru | .............. C04B 35/01 |
| | | | | 204/298.13 |
| 2018/0186699 | A1 | 7/2018 | Sugawara et al. | |

FOREIGN PATENT DOCUMENTS

| | | |
|---|---|---|
| JP | 2003105532 A | 4/2003 |
| WO | 2013183277 A1 | 12/2013 |

OTHER PUBLICATIONS

Dec. 6, 2016, International Search Report issued in the International Patent Application No. PCT/JP2016/082591.

Jun. 21, 2016, Notification of Reasons for Refusal issued by the Japan Patent Office in the corresponding Japanese Patent Application No. 2015-217825.

Nov. 15, 2018, Office Action issued by the State Intellectual Property Office in the corresponding Chinese Patent Application No. 201680004806.5.

\* cited by examiner

MN—ZN—O SPUTTERING TARGET AND PRODUCTION METHOD THEREFOR

CROSS-REFERENCE TO RELATED APPLICATIONS

The present application claims priority to Japanese Patent Application No. 2015-217825 (filed on Nov. 5, 2015). The content of the application is incorporated herein by reference in its entirety.

TECHNICAL FIELD

This disclosure relates to a Mn—Zn—O sputtering target and a production method therefor. This disclosure relates in particular to a Mn—Zn—O sputtering target containing at least one element X (the element X is W or Mo) in the chemical composition, which is preferably used for the formation of a recording layer of an optical data storage medium, and a production method for producing the sputtering target.

BACKGROUND

A sputtering method in which a sputtering target made of an alloy or a sintered body is bombarded with ions of Ar etc. is widely used in various technical fields including glass coating, semiconductor device fabrication, flat panel display manufacturing, and the formation of a recording layer in an optical data storage medium.

In particular, for example, in the technical field of optical data storage media, there are increasing demands for higher capacity as the amount of data to be handled increases. Here, optical data storage media are broadly classified as read-only and recordable, and the recordable media can be divided into two types: write once and rewritable. Conventionally, organic dye materials have been widely studied as materials for recording layers of write-once optical discs; on the other hand, as larger storage capacity is increasingly demanded in recent years, inorganic materials have come to be widely studied.

Under the current circumstances, palladium oxide-based materials are practically used as materials for inorganic recording layers of write-once optical discs. However, since Pd is a rare metal, the material cost is high. Given these factors, manganese oxide-based materials are developed as materials for the inorganic recording layer to achieve sufficiently good recording properties at a low material cost.

WO 2013/183277 A (PTL 1) proposes, as a recording layer made of such a manganese oxide-based material, a Mn—Zn—Ma—O-based recording layer containing an oxide of Mn and an oxide of a metal Ma (the metal Ma is selected from Mg, Mo, Si, and Te) which further contains a metal M (selected from Sn, Zn, Bi, etc.). PTL 1 discloses co-sputtering (also referred to as "combinatorial sputtering" or "multi-target sputtering") as a specific technique for forming the above Mn—Zn—Ma—O-based recording layer. Using the techniques described in PTL 1, a Mn—Zn—Ma—O-based recording layer can be obtained without the use of Pd which is a rare metal.

CITATION LIST

Patent Literature

PTL 1: WO 2013/183277 A

SUMMARY

Technical Problem

Combinatorial sputtering can be given one of the methods for forming a layer containing a plurality of kinds of elements, like a Mn—Zn—Ma—O recording layer made of the above-mentioned materials. Combinatorial sputtering is a sputtering using targets of the respective elements as disclosed in PTL 1. Another method may be a method in which a sheet of a composite target containing a plurality of elements is used as a single target for sputtering. Combinatorial sputtering however has disadvantages in that the large scale system used leads to increased cost and that composition deviation would easily occur. Considering the disadvantages, in terms of mass production, direct current (DC) sputtering using a sheet of a composite target is preferably used.

PTL 1 cited above proposes, as a sputtering target for fabricating data storage media, a target containing an oxide of Mn, in which part or the whole of the oxide of Mn is present in the form of an oxide of Mn with a valence of less than +4. PTL 1 also proposes that the Mn present in the form of an oxide in the above target is preferably $Mn_3O_4$ resistant to thermal decomposition. The target may further contain a metal other than Mn or an oxide of the metal, and PTL 1 also proposes that this metal is composed of one or more elements selected from the group consisting of Sn, Zn, Bi, Ge, Co, W, Cu, and Al. Also proposed is that any one of the metal elements of Zr, Al, Ta, Mo, Si, Mg, Hf, V, Ti, Sb, and Te can be added to the target.

However, PTL 1 does not refer to any specific Mn—Zn—O composite sputtering target. Accordingly, any Mn—Zn—O composite sputtering target containing Mn, Zn, an element X (X is W or Mo), and O in the chemical composition has not been established.

In view of the above, it could be helpful to provide a Mn—Zn—O sputtering target containing an element X (X is W or Mo) and a production method therefor.

Solution to Problem

The inventors made diligent studies to address the above challenges, and tried to prepare a Mn—Zn—W—O sputtering target using manganese oxide powder, zinc oxide powder, and tungsten oxide powder as raw materials. They also tried to prepare a Mn—Zn—Mo—O sputtering target using molybdenum oxide powder as a raw material instead of tungsten oxide powder in the Mn—Zn—W—O sputtering target. Thus experimentally produced sputtering targets both exhibited high resistance, and sufficient conductivity was not achieved. Accordingly, when they are subjected to DC sputtering, anomalous (also referred to as "arcing") would occur. With this being the case, a Mn—Zn—W—O sputtering target and a Mn—Zn—Mo—O sputtering target were experimentally prepared using the above elements all in the metal powder form as raw materials. However, since the melting point of metallic zinc is lower compared with that of zinc oxide, it is difficult to prepare a sputtering target with sufficient quality.

Thereupon, the inventors envisaged to prepare a sputtering target using oxide powder and metal powder in combination as a raw material powder in order to achieve both higher density and lower resistance of the sputtering target. The inventors found that when a Mn—Zn—O sputtering target containing an element X (X is W or Mo) satisfy predetermined conditions of both density and resistance, anomalous discharge does not occur even when it is subjected to DC sputtering. This discovery led to the present disclosure.

This disclosure is based on the findings made by the inventors, and means to address the above challenges are as follows.

<1> A Mn—Zn—O sputtering target comprising a chemical composition containing Mn, Zn, O, and at least one element X, the element X being a single one or two elements selected from the group consisting of W and Mo, wherein a relative density of the target is 90% or more and a specific resistance thereof is $1\times10^{-3}$ Ω·cm or less.

In the Mn—Zn—O sputtering target according to <1> above, particles of the element X are dispersed in the mixed phase. Accordingly, a Mn—Zn—O sputtering target that can withstand DC sputtering can be provided.

<2> The Mn—Zn—O sputtering target according to <1> above, wherein the element X is W, from an X-ray diffraction pattern of the Mn—Zn—O sputtering target, a ratio $P_{MnO}/P_w$ of a maximum peak intensity $P_{MnO}$ of a peak due to a manganese oxide composed of only Mn and O to a maximum peak intensity $P_w$ of a peak due to W is 0.027 or less, and a ratio $P_{WMnO}/P_w$ of a maximum peak intensity $P_{WMnO}$ of a peak due to a WMnO$_4$ crystalline phase to the maximum peak intensity $P_w$ is 0.024 or more.

<3> The Mn—Zn—O sputtering target according to <1> above, wherein the element X is Mo, from an X-ray diffraction pattern of the Mn—Zn—O sputtering target, a ratio $P_{MnO}/P_{Mo}$ of a maximum peak intensity $P_{MnO}$ of a peak due to a manganese oxide composed of only Mn and O to a maximum peak intensity $P_{Mo}$ of a peak due to Mo is 0.027 or less, and a ratio $P_{ZnMoO}/P_{Mo}$ of a maximum peak intensity $P_{ZnMoO}$ of a peak due to a Zn$_2$Mo$_3$O$_8$ crystalline phase to the maximum peak intensity $P_{Mo}$ is 0.015 or more.

<4> The Mn—Zn—O sputtering target according to any one of <1> to <3> above, wherein the chemical composition contains Mn: 4 at % (atomic %) to 40 at %, Zn: 15 at % to 60 at %, and the element X: 5 at % to 40 at % with respect to the total 100 at % of Mn, Zn, and the element X.

<5> The Mn—Zn—O sputtering target according to any one of <1> to <3> above, wherein the chemical composition further includes a single one or two or more elements selected from the group consisting of Cu, Mg, Ag, Ru, Ni, Zr, Sn, Bi, Ge, Co, Al, In, Pd, Ga, Te, V, Si, Ta, Cr, and Tb.

<6> The Mn—Zn—O sputtering target according to <5> above, wherein a content of the single one or two or more elements selected from the group consisting of Cu, Mg, Ag, Ru, Ni, Zr, Sn, Bi, Ge, Co, Al, In, Pd, Ga, Te, V, Si, Ta, Cr, and Tb is 8 at % to 70 at % with respect to the total 100 at % of the constituent elements of the sputtering target excluding O.

<7> A production method for producing the Mn—Zn—O sputtering target according to <1> above, comprising:

a mixing step of wet mixing mixed powder containing manganese oxide powder, zinc oxide powder, and metal powder including the element X as a component for 12 hours or longer; and a sintering step of sintering the mixed powder at a temperature of 700° C. or higher after the mixing step.

The production method according to <7> above can provide a production method for producing a Mn—Zn—O sputtering target which can be used for DC sputtering.

<8> The production method according to <7> above, wherein the mixed powder further includes a powder made of a single one element or a compound of two or more elements selected from the group consisting of Cu, Mg, Ag, Ru, Ni, Zr, Sn, Bi, Ge, Co, Al, In, Pd, Ga, Te, V, Si, Ta, Cr, and Tb.

Advantageous Effect

We provide a Mn—Zn—O sputtering target which makes it possible to solve the above conventional problems and to achieve the above objectives and can withstand DC sputtering, and a production method for producing the sputtering target.

DETAILED DESCRIPTION (Mn—Zn—O Sputtering Target)

Figure 1:
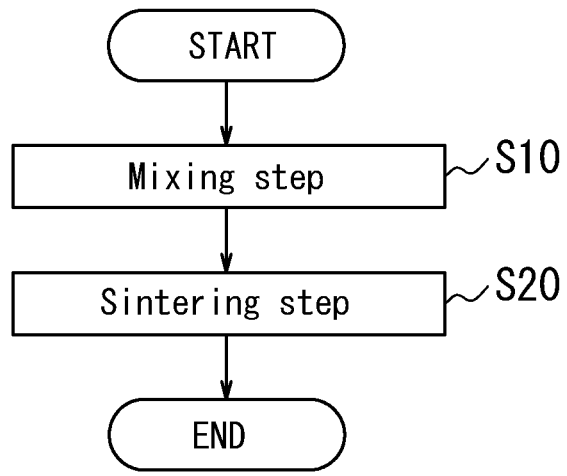
FIG. 1 is a flowchart illustrating a production method for producing a sputtering target according to one embodiment.

A Mn—Zn—O sputtering target of this disclosure is a Mn—Zn—O sputtering target comprising a chemical composition containing Mn, Zn, an element X, and O in the chemical composition. The Mn—Zn—O sputtering target of this disclosure is hereinafter simply referred to as "target". The target will be described below in detail. Note that the element X is a single one or two elements selected from the group consisting of W and Mo, and this is hereinafter simply described as "the element X is W or Mo".

<Target>

A target according to one embodiment contains Mn, Zn, an element X, and O in the chemical composition and optionally further contains other chemical compositions.

It is important that the relative density of the target is 90% or more, and the specific resistance thereof is $1\times10^{-3}$ Ω·cm or less.

<<Element X>>

As described above, the element X is W or Mo. Specifically, the element X can be made of a single one element of W; otherwise, the element X can be made of a single element of Mo. Alternatively, the element X can consist of two elements of W and Mo. As used herein, the element X consisting of two elements of W and Mo means that both W and Mo are included in the chemical composition of the target.

<<Relative Density>>

In this specification, the relative density of the target according to this embodiment is used as an index of the density of the target. Accordingly, a high relative density of the target indicates that the target has high density. It is one of the characteristic features of this disclosure that the target has a relative density of 90% or more.

Note that the relative density is a density of the target actually measured after the raw material powders of the target are sintered relative to an assumed density obtained by calculating the density of the target assuming that 100% of the raw material powders of the target are packed.

The relative density of the target according to this embodiment is preferably 91% or more, more preferably 92% or more. The higher the relative density, the better is the target.

<<Specific Resistance>>

On the other hand, the specific resistance is herein used as an index of the resistance of the target according to this embodiment. Accordingly, a lower relative resistance of the target indicates that the target has lower resistance. It is one of the characteristic features of this disclosure that the target has a specific resistance of $1 \times 10^{-3}$ Ω·cm or less. The specific resistance of the target is preferably $9 \times 10^{-4}$ Ω·cm or less, more preferably $8 \times 10^{-4}$ Ω·cm or less. The lower the specific resistance, the better is the target.

It was confirmed by the inventors that when being subjected to DC sputtering, the target according to this embodiment satisfying the conditions of both the specific resistance and the relative density can prevent anomalous discharge from occurring. It was also confirmed that if only one of the conditions is satisfied, the occurrence of anomalous discharge cannot be sufficiently prevented. Thus, according to this embodiment, a Mn—Zn—O sputtering target that can withstand DC sputtering can be provided. The target according to this embodiment is particularly preferably used for the formation of a recording layer of an optical data storage medium; however, the application of the target is not limited.

<Peak of W>

Here, from an X-ray diffraction pattern of the target according to this embodiment, when the element X is W, a ratio $P_{MnO}/P_w$ of a maximum peak intensity $P_{MnO}$ of a peak due to a manganese oxide composed of only Mn and O to a maximum peak intensity $P_w$ of a peak due to W is preferably 0.027 or less. Further, a ratio $P_{WMnO}/P_w$ of a maximum peak intensity $P_{WMnO}$ of a peak due to a WMnO$_4$ crystalline phase to the maximum peak intensity $P_w$ is preferably 0.024 or more. When these conditions are met, the target has high density. These peak intensities will be described in more detail below.

<<Manganese Oxide Composed of Only Mn and O>>

First, manganese oxide composed of only Mn and O is a manganese oxide such as Mn$_3$O$_4$ (Manganese(II, III) oxide) or Mn$_2$O$_3$ (Manganese(III) oxide), excluding manganese composite oxides containing any element other than Mn and O, for example, WMnO$_4$. Other examples of the manganese oxide include MnO, MnO$_2$, MnO$_3$, and Mn$_2$O$_7$. Hereinafter, of manganese oxides, manganese oxides composed of only Mn and O are simply referred to as "manganese oxides", and manganese composite oxides containing any element other than Mn and O are referred to as "manganese composite oxide". Thus, they are classified. The target according to this embodiment preferably has substantially no manganese oxide crystalline phase, and the substantial presence or absence of the crystalline phase can be determined using X-ray diffraction peak intensities.

—Intensity from X-ray Diffraction Pattern of Target—

The X-ray diffraction pattern of the target can be obtained by a usual method; for example, the pattern can be obtained by performing θ-2θ scanning on the surface of the target using SmartLab available from Rigaku Corporation. The measurement conditions for the X-ray diffraction crystallography depend on the target as appropriate, and can be selected for example from the following conditions.

X-ray source: Cu—Kα X-ray
Output power settings: 20 kV-100 kV, 10 mA-100 mA
Measurement angle range: 2θ=5°-80°
Scan rate: 1°-4° (2θ/min), continuous scanning
Divergence slit: 0.5°-2°
Scattering slit: 0.5°-2°
Receiving slit: 0.1 mm-0.5 mm —W Peak Intensity—

Diffraction peaks of W are detected for example at ranges of 40.26°±0.3° and 58.27°±0.3°, and the maximum intensity of these peaks is the maximum peak intensity $P_w$ (unit: cps, hereinafter) of a peak due to W, which can be defined as a reference intensity. When the element X is W, from the X-ray diffraction pattern of the target, the maximum peak intensity $P_w$ of a peak due to W is often the maximum intensity of the maximum peak intensities of the peaks of the respective components in the target. For the maximum peak intensity $P_{MnO}$ of a peak due to manganese oxide, for example, diffraction peaks of Mn$_3$O$_4$ are detected for example at ranges of 28.88°±0.3° and 59.84°±0.3°, and diffraction peaks of Mn$_2$O$_3$ are detected for example at ranges of 32.98°±0.3° and 55.24°±0.3°. Of those peak intensities, when diffraction peaks of manganese oxide are significantly detected, the maximum peak intensity of a peak due to manganese oxide is the maximum peak intensity $P_{MnO}$. When diffraction peaks of manganese oxide are lost in the background of the X-ray diffraction pattern (for example, when each peak intensity is equal to 1.1 times the intensity of the background or lower), the diffraction peaks are regarded as not being detected, in which case the peak intensity $P_{MnO}$ is 0 (zero).

When the ratio $P_{MnO}/P_w$ is 0.027 or less, the target can be regarded as having no substantial crystalline phase of manganese oxide. No substantial crystalline phase of manganese oxide being present in the target means that sintering has sufficiently proceeded to increase the relative density, resulting in high sintering density.

Note that the ratio $P_{MnO}/P_w$ is not limited in particular within the above-described range; however, it is preferably 0.027 or less, more preferably 0.01 or less. Most preferably it is 0 (i.e., diffraction peaks of manganese oxide are not detected).

<<WMnO$_4$ Crystalline Phase>>

As an indication of high relative density of the target having an element X of W, the target preferably has a WMnO$_4$ crystalline phase. This is because when sintering proceeds sufficiently, WMnO$_4$ structures appear. The presence of a WMnO$_4$ crystalline phase can be determined by the presence of a peak due to a WMnO$_4$ crystalline phase. In this embodiment, the peak due to the WMnO$_4$ crystalline phase are preferably observed. Note that "the peak due to the WMnO$_4$ crystalline phase are observed" means that significant relevant peak is detected relative to the background of the X-ray diffraction pattern.

—Peak Intensity $P_{WMnO}$ of a Peak Due to WMnO$_4$ Crystalline Phase—

Diffraction peaks of a WMnO$_4$ crystalline phase are detected for example at ranges of 29.80°±0.3° and 30.23°±0.3°. The intensity of the peak having the maximum intensity of these peaks is the peak intensity $P_{WMnO}$, in which case the ratio $P_{WMnO}/P_w$ is preferably 0.02 or more, since this ensures the presence of a WMnO$_4$ crystalline phase. Further, the ratio $P_{WMnO}P_w$ is more preferably 0.03 or more, most preferably 0.04 or more.

<Peak of Mo>

From the X-ray diffraction pattern of the target according to this embodiment, when the element X is Mo, a ratio $P_{MnO}/P_{Mo}$ of a maximum peak intensity $P_{MnO}$ of a peak due to a manganese oxide composed of only Mn and O to a maximum peak intensity $P_{Mo}$ of a peak due to Mo is preferably 0.027 or less. Further, a ratio $P_{ZnMoO}/P_{Mo}$ of a maximum peak intensity $P_{ZnMoO}$ of a peak due to a Zn$_2$Mo$_3$O$_8$ crystalline phase to the maximum peak intensity $P_{Mo}$ is preferably 0.015 or more. When these conditions are met, it is ensured that the target has high relative density. These peak intensities will be described in more detail below.

—Mo Peak Intensity—

Diffraction peaks of Mo are detected for example at ranges of 40.52°±0.3° and 58.61°±0.3°, and the maximum intensity of these peaks is the maximum peak intensity $P_{Mo}$ (unit: cps, hereinafter) of a peak due to Mo, which can be defined as a reference intensity. When the element X is Mo, from the X-ray diffraction pattern of the target, the maximum peak intensity $P_{Mo}$ of a peak due to Mo is often the maximum intensity of the maximum peak intensities of the peaks of the respective components in the target. When the ratio $P_{MnO}/P_{Mo}$ is 0.027 or less, the target can be regarded as having no substantial crystalline phase of manganese oxide as with the case where the element is W.

Note that the ratio $P_{MnO}/P_{Mo}$ is not limited in particular within the above-described range; however, it is preferably 0.02 or less, more preferably 0.01 or less. Most preferably it is 0 (i.e., diffraction peaks of manganese oxide are not detected).

<<$Zn_2Mo_3O_8$ Crystalline Phase>>

As an indication of high relative density of the target having an element X of Mo, the target preferably has a $Zn_2Mo_3O_8$ crystalline phase. This is because when sintering proceeds sufficiently, $Zn_2Mo_3O_8$ structures appear. The presence of a $Zn_2Mo_3O_8$ crystalline phase can be determined by the presence of peaks of a $Zn_2Mo_3O_8$ crystalline phase. In this embodiment, peaks of a $Zn_2Mo_3O_8$ crystalline phase are preferably observed. Note that "peaks of a $Zn_2Mo_3O_8$ crystalline phase are observed" means that significant relevant peaks are detected above the background pattern of the X-ray diffraction pattern.

—Peak Intensity $P_{ZnMoO}$ of a Peak due to $Zn_2Mo_3O_8$ Crystalline Phase—

Diffraction peaks of a $Zn_2Mo_3O_8$ crystalline phase are detected for example at ranges of 17.88°±0.3° and 25.27°±0.3°. The intensity of the peak having the maximum intensity of these peaks is the peak intensity $P_{ZnMoO}$, in which case the ratio $P_{ZnMoO}/P_{Mo}$ is preferably 0.015 or more, since this ensures the presence of a $Zn_2Mo_3O_8$ crystalline phase. Further, the ratio $P_{ZnMoO}/P_{Mo}$ is more preferably 0.02 or more, most preferably 0.03 or more.

In the case where both W and Mo are used for the element X, it can be confirmed using $P_W$ and $P_{Mo}$ that a manganese oxide crystalline phase is substantially not observed in the target and that a $WMnO_4$ crystalline phase and a $Zn_2Mo_3O_8$ crystalline phase are observed in the target, respectively.

<<Component Ratio>>

The component ratio of a target according to this embodiment is not limited in particular, and can be selected appropriately depending on the intended use of the target. For example, with respect to the total 100 at % (atomic %) of Mn, Zn, and the element X, the component ratio can be Mn: 4 at % to 40 at %, Zn: 15 at % to 60 at %, and the element X: 5 at % to 40 at %.

<<Other Components>>

The target according to this embodiment may further contain other metal elements as necessary. When the target according to this embodiment is used for example for the formation of a recording layer of a data storage medium, appropriate inclusion of those metal elements allows for variations in the transmissivity, reflectivity, and record sensitivity of the recording layer, thereby obtaining a recording layer having a multi-layer structure. To this end, preferably, the target according to this embodiment further includes a single one or two or more elements selected from the group consisting of Cu, Mg, Ag, Ru, Ni, Zr, Sn, Bi, Ge, Co, Al, In, Pd, Ga, Te, V, Si, Ta, Cr, and Tb in the chemical composition.

—Component Ratio of Other Components—

The content of the single one or two or more elements selected from the group consisting of Cu, Mg, Ag, Ru, Ni, Zr, Sn, Bi, Ge, Co, Al, In, Pd, Ga, Te, V, Si, Ta, Cr, and Tb can be 8 at % to 70 at % with respect to the total 100 at % of the constituent elements of the sputtering target excluding O (oxygen). The content can be selected appropriately within the range depending on the intended use of the target.

The shape of the target according to this embodiment can be a given shape, for example, but not limited to, a disk shape, a cylindrical shape, a quadrangular sheet shape, an oblong sheet shape, or a square sheet shape. The shape can be selected appropriately depending on the intended use of the target. Further, the width and depth (diameter in the case of a circular shape) of the target can also be selected from an approximate range from the order of mm to the order of m appropriately depending on the intended use of the target. For example, when the target is circular, the diameter is typically around 50 mm to 300 mm. In the same way, the thickness of the target can be appropriately selected depending on the use of the target and is typically about 1 mm to 20 mm.

<Production Method for Producing Target>

Next, a production method for producing the target according to one embodiment described above will be described with reference to FIG. 1. The production method for producing the target according to one embodiment includes a mixing step (S10) and a sintering step (S20), and optionally further includes other appropriately selected steps.

<<Mixing Step (S10)>>

The mixing step (S10) is a step of wet mixing mixed powder containing manganese oxide powder, zinc oxide powder, and metal powder including the element X as a component for 12 hours or longer.

Examples of the wet mixing method include, but not limited to, a wet mixing method using a conventionally known ball mill system, and can be selected appropriately depending on the intended use of the target. The mixed powder to be mixed in this step and the mixing conditions will be described below.

The mixed powder contains manganese oxide powder, zinc oxide power, and metal powder containing an element X as a component, and may optionally contain other powders.

—Manganese Oxide Powder—

The manganese oxide powder can be selected appropriately depending on the intended use of the target. Examples include in addition to $Mn_3O_4$ (Manganese(II,III) oxide) and $Mn_2O_3$ (Manganese(III) oxide); MnO, $MnO_2$, $MnO_3$ and $Mn_2O_7$, $Mn_3O_4$ and $Mn_2O_3$. One of these compounds may be used alone or in combination with one or more of the other compounds.

Of these compounds, $Mn_3O_4$ powder is more preferable in terms of the relationship between the sintering temperature and the melting point.

The average particle diameter of the manganese oxide powder can be appropriately selected depending on the intended use of the target. The average particle diameter of the $Mn_3O_4$ powder can be around 3 μm to 7 μm typical of commercially available $Mn_3O_4$ powder.

—Zinc Oxide Powder—

The zinc oxide powder can be selected appropriately depending on the intended use of the target. Examples can include zinc oxide (ZnO) powder and zinc peroxide (ZnO$_2$) powder. One of these compounds may be used alone or in combination with one or more of the other compounds.

Of these compounds, ZnO powder is more preferable in terms of the relationship between the sintering temperature and the melting point.

The average particle diameter of the zinc oxide powder can be appropriately selected depending on the intended use of the target. The average particle diameter of the ZnO powder can be around 1 µm to 3 µm typical of commercially available ZnO powder.

—Metal Powder Containing Element X as Component—

The metal powder containing the element X as a component can be selected appropriately depending on the intended use of the target. Examples can include tungsten metal powder made of W alone and molybdenum metal powder made of Mo alone. One of these powders may be used alone or in combination with one or more of the other powders. When the element X consists of W and Mo, tungsten metal powder and molybdenum metal powder are used together.

The average particle diameter of the metal powder including the element X as a component can be appropriately selected depending on the intended use of the target. The average particle diameter of the tungsten metal powder can be around 2 µm to 5 µm typical of commercially available tungsten metal powder. The average particle diameter of the molybdenum metal powder can be around 1 µm to 5 µm typical of commercially available molybdenum metal powder.

—Other Powders—

Other powders can be selected appropriately depending on the intended use of the target. Examples include a powder made from a single one element or a compound of two or more elements selected from the group consisting of Cu, Mg, Ag, Ru, Ni, Zr, Sn, Bi, Ge, Co, Al, In, Pd, Ga, Te, V, Si, Ta, Cr, and Tb. Here, depending on the intended use of the target to be produced, the powder(s) selected can be included in the mixed powder.

—Mixing Time—

Here, it is important in this embodiment to wet mix the mixed powder for 12 hours or longer. A mixing time of 12 hours or longer allows the mixed powder to be sufficiently mixed, so that a solid-state reaction of manganese oxide is promoted during sintering, and a manganese oxide crystalline phase can be prevented from being left after sintering. Further, within the above range, the mixing time is particularly preferably 16 hours or longer, more preferably 20 hours or longer, and most preferably 24 hours or longer. When mixing for 24 hours, the effect of mixing is saturated; however, mixing may be performed for more than 24 hours. An upper limit of 168 hours may be set for the mixing time in consideration of industrial productivity, but this is not intended to be a restriction on the upper limit.

<<Sintering Step (S20)>>

The sintering step (S20) is a step performed after the mixing step (S10), and is a sintering step of sintering the mixed powder at a temperature of 700° C. or higher.

—Sintering—

The method of sintering can be selected appropriately depending on the intended use of the target. Examples include, but not limited to, hot pressing in an inert gas atmosphere and hot isostatic pressing (HIP).

In this occasion, it is important in this embodiment to sinter the mixed powder at a temperature of 700° C. or higher. A sintering temperature of 700° C. or higher can prevent a manganese oxide crystalline phase from being left after sintering.

The sintering time is not limited in particular, and can be selected as appropriate. As is typical, the sintering time may be around 1 hour to 6 hours.

Through the above steps, a Mn—Zn—O sputtering target having a relative density of 90% or more and a specific resistance of $1\times10^{-3}$ Ω·cm or less can be produced.

<<Other Steps>>

Other steps can be appropriately selected depending on the intended use of the target. Examples of other steps that may be performed include a mixed powder shaping step.

—Shaping Step—

The shaping step is not essential in the disclosed production method, but may be included for shaping in accordance with the target shape.

EXAMPLES

The Mn—Zn—O-based sputtering target and the production method for producing the Mn—Zn—O-based sputtering target according to this disclosure will be described in more detail below using examples. However, this disclosure is not limited to the following examples, and various modifications can be made to the examples without departing from the spirit of this disclosure.

Experimental Example 1

A target of Example 1-1 according to this disclosure was prepared using W as an element X, and targets of Comparative Examples 1-1 to 1-3 were prepared for comparison. Whether anomalous discharge had occurred in the sample targets or not was evaluated.

Example 1-1

The following powder was prepared as a raw material powder.

Mn$_3$O$_4$ powder—purity: 99.9% or more, average particle diameter: 5 µm

ZnO powder—purity: 99.9% or more, average particle diameter: 1.4 µm

W powder—purity: 99.9% or more, average particle diameter: 2 µm

The Mn$_3$O$_4$ powder, ZnO powder and W powder above were weighed so that the ratio of the metal elements was Mn:Zn:W=20:50:30 (at %). The weighed raw material powders, zirconia balls (diameter: 5 mm) having a weight three times the total weight of the raw material powders, and an alcohol were charged into a plastic container and were subjected to wet mixing in a ball mill system for 24 hours. After being dried, the mixed powder was sifted using a sieve having an aperture size of 500 µm. Subsequently, the mixed powder was hot pressed in an inert gas atmosphere at sintering temperature: 900° C., pressure: 200 kgf/cm$^2$ for sintering time: 2 hours. Lastly, the sintered compact was bonded to a backing plate made of oxygen free copper by In solder bonding, thereby obtaining the target according to Example 1-1.

Example 1-2

A target according to Example 1-2 was prepared in the same manner as in Example 1-1 except that the sintering temperature was 860° C. instead of the sintering temperature of 900° C. as in Example 1-1 and the mixing time was 12 hours instead of the mixing time of 24 hours in Example 1-1.

Comparative Example 1-1

A target according to Comparative Example 1-1 was prepared in the same manner as in Example 1-1 except that the mixing time was 2 hours instead of the mixing time of 24 hours in Example 1-1.

Comparative Example 1-2

A target according to Comparative Example 1-2 was prepared in the same manner as in Example 1-1 except that the sintering temperature was 700° C. instead of the sintered temperature of 900° C. in Example 1-1.

Comparative Example 1-3

A target according to Comparative Example 1-3 was prepared in the same manner as in Comparative Example 1-1 except that the sintering temperature was 700° C. instead of the sintered temperature of 900° C. in Comparative Example 1-1.

Comparative Example 1-4

A target according to Comparative Example 1-4 was prepared in the same manner as in Comparative Example 1-1 except that the sintering temperature was 820° C. instead of the sintering temperature of 900° C. in Comparative Example 1-1 and the mixing time was 4 hours instead of the mixing time of 24 hours in Comparative Example 1-1.

<Evaluation>

The targets prepared according to Examples 1-1 to 1-2 and Comparative Examples 1-1 to 1-4 above were subjected to (A) relative density measurement, (B) specific resistance measurement, (C) evaluation of whether anomalous discharge had occurred, and (D) evaluation of components using X-ray diffraction crystallography. The evaluations were performed as described below.

(A) Relative Density Measurement

In order to calculate the relative density, the size of each target of Examples 1-1 to 1-2 and Comparative Examples 1-1 to 1-4 was measured and the weight of the target was then measured to calculate the density of the target. Next, the relative density was calculated using the following equation.

[Relative density]=[Actual measured density of sintered body]/[Assumed density calculated assuming 100% of raw material powder is packed]

The results are presented in Table 1.

(B) Specific Resistance Measurement

The specific resistance in each of Examples 1-1 to 1-2 and Comparative Examples 1-1 to 1-4 was measured using a resistivity meter MCP-T610 available from Mitsubishi Chemical Analytech, Co., Ltd. The results are presented in Table 1.

(C) Evaluation of Whether Anomalous Discharge Occurred

Each target of Examples 1-1 to 1-2 and Comparative Examples 1-1 to 1-4 was attached to a sputtering system and subjected to DC sputtering in turn. Specifically, the sputtering system was evacuated in vacuum to $1\times10^{-4}$ Pa or less, Ar gas and $O_2$ gas were introduced into the system, and the pressure in the system was set to 0.3 Pa. The partial pressure of oxygen ($[O_2]/[Ar+O_2]$) was 70%. The sputtering was performed for 30 minutes by supplying a power of 5 W/cm² using a DC power source, and the number of anomalous discharges that occurred during sputtering was counted using an arc counter. Note that an anomalous discharge immediately after the start of sputtering discharge was excluded from the count. The results are presented in Table 1.

(D) Component Evaluation

Figure 2:
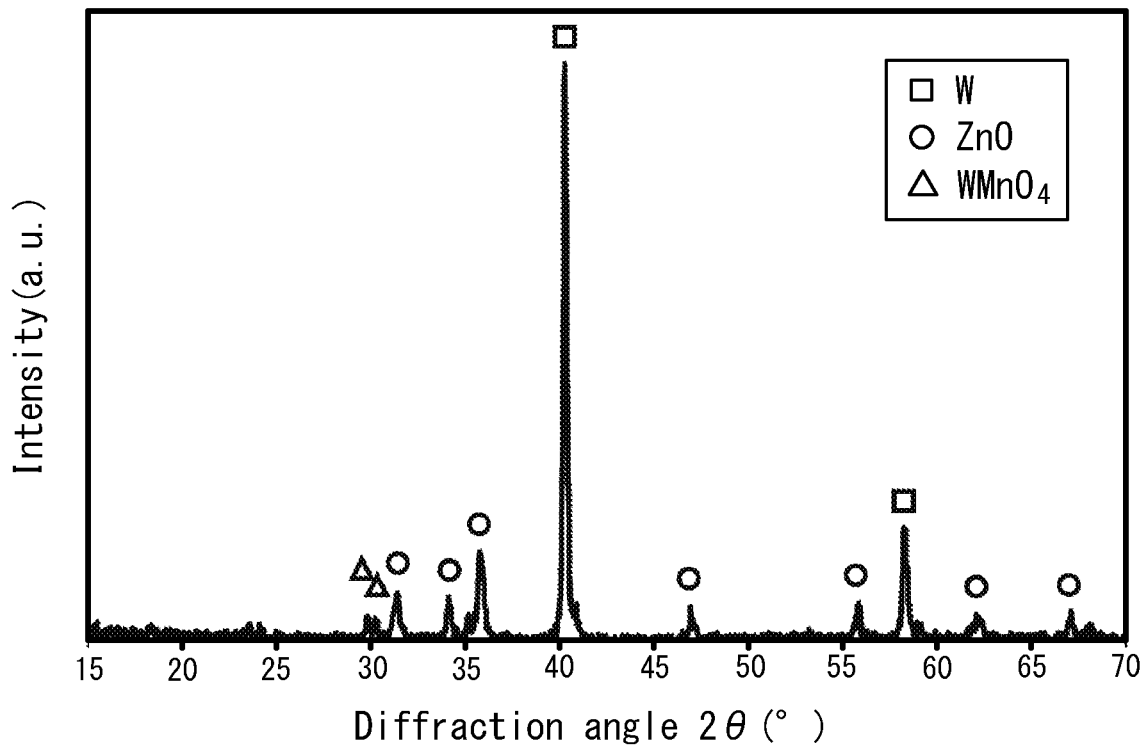
FIG. 2 illustrates an X-ray diffraction pattern of a sputtering target according to Example 1-1.

Components in the targets of Example 1-1 and Comparative Example 1-1 that exhibited a relative density of more than 90% were evaluated by X-ray diffraction crystallography. X-ray diffraction crystallography was performed by θ-2θ scanning using SmartLab available from Rigaku Corporation, thereby obtaining X-ray diffraction pattern. FIG. 2 displays the X-ray diffraction pattern of the target according to Example 1-1 as a representative. The intensity is expressed in arbitrary unit (a.u.). The evaluation conditions are as follows.

X-ray source: Cu—Kα X-ray
Output power settings: 30 kV, 15 mA
Measurement angle range: 2θ=15°-70°
Scan rate: 2° (2θ/min), continuous scanning
Divergence slit: 1°
Scattering slit: 1°
Receiving slit: 0.3 mm In Example 1-1, the peak intensity ratio $P_{MnO}/P_w$ was 0, and the ratio $P_{WMnO}/P_w$ was 0.04. On the other hand, in Comparative Example 1-1, the peak intensity ratio $P_{MnO}/P_w$ was 0.03, and the ratio $P_{WMnO}/P_w$ was 0.

TABLE 1

| Target | Preparation conditions | | Relative density | Specific resistance ($\Omega \cdot cm$) | Number of anomalous discharges |
|---|---|---|---|---|---|
| | Mixing time | Sintering temperature | | | |
| Example 1-1 | 24 h | 900° C. | 95.0% | $5.0 \times 10^{-4}$ | 0 |
| Example 1-2 | 12 h | 860° C. | 90.5% | $9.0 \times 10^{-4}$ | 0 |
| Comparative Example 1-1 | 2 h | 900° C. | 91.0% | $2.0 \times 10^{-3}$ | 30 |
| Comparative Example 1-2 | 24 h | 700° C. | 89.0% | $8.0 \times 10^{-4}$ | 5 |
| Comparative Example 1-3 | 2 h | 700° C. | 85.0% | $5.0 \times 10^{-3}$ | 50 |
| Comparative Example 1-4 | 4 h | 820° C. | 89.5% | $1.1 \times 10^{-3}$ | 10 |

The above results demonstrated that when the element X was W, in the targets according to Examples 1-1 and 1-2 that satisfied the conditions of both the relative density and specific resistance of this disclosure, the occurrence of anomalous discharge was prevented. In the case of Comparative Examples 1-1 and 1-2 satisfying one of the conditions of the relative density and specific resistance, the number of anomalous discharges decreased as compared with Comparative Example 1-3, yet was not sufficiently reduced to a degree such that the targets could withstand DC sputtering. Even in Comparative Example 1-4, in which the relative density was close to 90% meeting the condition of this disclosure and the specific resistance was also close to $1\times10^{-3}$ $\Omega\cdot cm$ meeting the condition of this disclosure, anomalous discharge was not sufficiently reduced.

Experimental Example 2

A target of Example 2-1 according to this disclosure was prepared using Mo as an element X, and targets of Comparative Examples 2-1 to 2-3 were prepared for comparison. Whether anomalous discharge had occurred in the sample targets or not was evaluated.

Example 2-1

The following powder was prepared as a raw material powder.

Mn$_3$O$_4$ powder—purity: 99.9% or more, average particle diameter: 5 μm

ZnO powder—Purity: 99.9% or more, average particle diameter: 1.4 μm

Mo powder—purity: 99.9% or more, average particle diameter: 2 μm

The Mn$_3$O$_4$ powder, ZnO powder and Mo powder above were weighed so that the ratio of the metal elements was Mn:Zn:Mo=20:50:30 (at %). The weighed raw material powders, zirconia balls (diameter: 5 mm) having a weight three times the total weight of the raw material powders, and an alcohol were charged into a plastic container and were subjected to wet mixing in a ball mill system for 24 hours. After being dried, the mixed powder was sifted using a sieve having an aperture size of 500 μm. Subsequently, the mixed powder was hot pressed in an inert gas atmosphere at sintering temperature: 900° C., pressure: 200 kgf/cm$^2$ for sintering time: 2 hours. Lastly, the mixed powder was joined to a back plate made of oxygen free copper by In solder bonding, thereby obtaining the target according to Example 2-1.

Comparative Example 2-1

A target according to Comparative Example 2-1 was prepared in the same manner as in Example 2-1 except that the mixing time was 2 hours instead of the mixing time of 24 hours as in Example 2-1.

Comparative Example 2-2

A target according to Comparative Example 2-2 was prepared in the same manner as in Example 2-1 except that the sintering temperature was 700° C. instead of the sintered temperature of 900° C. as in Example 2-1.

Comparative Example 2-3

A target according to Comparative Example 2-3 was prepared in the same manner as in Comparative Example 2-1 except that the sintering temperature was 700° C. instead of the sintered temperature of 900° C. as in Comparative Example 2-1.

<Evaluation>

The targets prepared according to Example 2-1 and Comparative Examples 2-1 to 2-3 above were subjected to (A) relative density measurement, (B) specific resistance measurement, (C) evaluation of whether anomalous discharge had occurred, and (D) component evaluation in the same manner as in Example 1. The results are presented in Table 2.

In the evaluation (D), the peak intensity ratio P$_{MnO}$/P$_{Mo}$ was 0, and the ratio P$_{ZnMnO}$/P$_{Mo}$ was 0.03 in Example 2-1. On the other hand, in Comparative Example 2-1, the peak intensity ratio P$_{MnO}$/P$_{Mo}$ was 0.03, and the ratio P$_{ZnMnO}$/P$_{Mo}$ was 0.

TABLE 2

| Target | Preparation conditions | | | Specific resistance (Ω · cm) | Number of anomalous discharges |
|---|---|---|---|---|---|
| | Mixing time | Sintering temperature | Relative density | | |
| Example 2-1 | 24 h | 900° C. | 92.0% | 8.0 × 10$^{-4}$ | 0 |
| Comparative Example 2-1 | 2 h | 900° C. | 90.0% | 3.0 × 10$^{-3}$ | 70 |
| Comparative Example 2-2 | 24 h | 700° C. | 87.0% | 9.0 × 10$^{-4}$ | 20 |
| Comparative Example 2-3 | 2 h | 700° C. | 82.0% | 6.0 × 10$^{-3}$ | 100 |

The above results demonstrated that the same results were obtained also in the case where the element X was Mo as in Experimental Example 1. Specifically, it was confirmed that in the target according to Example 2-1 that satisfied the conditions of both the relative density and specific resistance of this disclosure, the occurrence of anomalous discharge was prevented. In the case of Comparative Examples 2-1 and 2-2 satisfying one of the conditions of the relative density and specific resistance, the number of anomalous discharges decreased as compared with Comparative Example 2-3 in which neither condition was met, yet anomalous discharges was not sufficiently reduced to a degree such that the targets could withstand DC sputtering.

INDUSTRIAL APPLICABILITY

We can provide a Mn—Zn—O sputtering target which can be used in DC sputtering particularly preferably for the formation of a recording layer of an optical data storage medium, and a production method for producing therefor.

REFERENCE SIGNS LIST

S10: Mixing step
S20: Sintering step

The invention claimed is:
1. A Mn—Zn—O sputtering target comprising a chemical composition consisting essentially of Mn, Zn, O, and at least one element X, the element X being a single one or two elements selected from the group consisting of W and Mo,
wherein a relative density of the target is 90% or more and a specific resistance thereof is 1×10$^{-3}$ Ω·cm or less, and
the chemical composition contains Mn: 4 at % to 40 at %, Zn: 15 at % to 60 at %, and the element X: 5 at % to 40 at % with respect to the total 100 at % of Mn, Zn, and the element X.
2. The Mn—Zn—O sputtering target according to claim 1,
wherein the element X is W,
from an X-ray diffraction pattern of the Mn—Zn—O sputtering target, a ratio P$_{MnO}$/P$_w$ of a maximum peak intensity P$_{MnO}$ of a peak due to a manganese oxide composed of only Mn and O to a maximum peak intensity P$_w$ of a peak due to W is 0.027 or less, and
a ratio P$_{WMnO}$/P$_w$ of a maximum peak intensity P$_{WMnO}$ of a peak due to a WMnO$_4$ crystalline phase to the maximum peak intensity P$_w$ is 0.024 or more.
3. The Mn—Zn—O sputtering target according to claim 1,
wherein the element X is Mo,
from an X-ray diffraction pattern of the Mn—Zn—O sputtering target, a ratio P$_{MnO}$/P$_{Mo}$ of a maximum peak intensity P$_{MnO}$ of a peak due to a manganese oxide composed of only Mn and O to a maximum peak intensity $P_{Mo}$ of a peak due to Mo is 0.027 or less, and a ratio $P_{ZnMoO}/P_{Mo}$ of a maximum peak intensity $P_{ZnMoO}$ of a peak due to a $Zn_2Mo_3O_8$ crystalline phase to the maximum peak intensity $P_{Mo}$ is 0.015 or more.

4. A production method for producing the Mn—Zn—O sputtering target according to claim 1, comprising:
- a mixing step of wet mixing mixed powder containing manganese oxide powder, zinc oxide powder, and metal powder including the element X as a component for 12 hours or longer; and
- a sintering step of sintering the mixed powder at a temperature of 700° C. or higher after the mixing step.

* * * * *